United States Patent [19]
Pollack et al.
[11] 3,915,766
[45] Oct. 28, 1975

[54] COMPOSITION FOR USE IN FORMING A DOPED OXIDE FILM

[75] Inventors: Gordon P. Pollack; John G. Fish, both of Richardson; Samuel R. Shortes, Plano, all of Tex.

[73] Assignee: Texas Instruments Incorporated, Dallas, Tex.

[22] Filed: Mar. 6, 1974

[21] Appl. No.: 448,577

Related U.S. Application Data

[62] Division of Ser. No. 258,173, May 31, 1972, Pat. No. 3,837,873.

[52] U.S. Cl. ................ 148/188; 148/186; 148/187; 106/287 SE

[51] Int. Cl.² ........................................... H01L 7/34

[58] Field of Search ............... 148/188; 106/287 SE; 117/201

[56] References Cited

UNITED STATES PATENTS

| | | | |
|---|---|---|---|
| 3,615,943 | 10/1971 | Genser | 148/188 |
| 3,660,156 | 5/1972 | Schmidt | 148/188 |

*Primary Examiner*—G. Ozaki
*Attorney, Agent, or Firm*—Hal Levine; James T. Comfort; Gary C. Honeycutt

[57] ABSTRACT

A doped silicon oxide-forming film is produced on a semiconductor wafer by coating the wafer with a solution prepared by the reaction of tetraethylorthosilicate with acetic anhydride in the presence of a suitable solvent. A suitable dopant species is also contained in the solution. Upon heating the wafer to diffusion temperature, a doped oxide film is formed, and the dopant diffuses from the doped oxide film into the semiconductor.

5 Claims, No Drawings

COMPOSITION FOR USE IN FORMING A DOPED OXIDE FILM

This is a division, of application Ser. No. 258,173, filed May 31, 1972, now U.S. Pat. No. 3,837,873.

This invention relates to the fabrication of semiconductor devices, and more particularly to techniques for the solid state diffusion of conductivity type-determining impurities from a doped silicon oxide film into a semiconductor wafer. Specifically, novel compositions are formulated for use in coating a semiconductor wafer to provide a doped silicon oxide film to serve as a source of dopant for solid state diffusion.

The use of a doped oxide film as a source of impurity for solid state diffusion in the fabrication of semiconductor devices has been known for many years. In theory, the doped oxide source provides improved control over dopant concentration, more uniform distribution of dopant concentrations and the ability to simultaneously diffuse n-type impurities in a single step. As a practical matter, however, these advantages have not been generally achieved by the industry, perhaps due to insufficient economic incentive, and also due to the lack of a convenient, low-temperature technique for the formation of a doped oxide film.

The concept of providing a stable liquid suspension or solution of doped oxide, or a solution of ingredients which yield a doped oxide film, has been proposed. However, commercial use of such techniques has been impeded by practical difficulties in formulating a suspension or solution which is sufficiently stable, sufficiently pure, and which can be formulated with sufficient reproducibility from batch to batch.

Accordingly, it is an object of the present invention to formulate an oxide-forming composition which provides adequate purity, adequate shelf life, and which can be reproduced to exact specifications on a commercial scale.

A further object of the invention is to formulate an oxide-forming composition which provides higher doping densities in the semiconductor to which it is applied as a diffusion source, as compared with the doping densities heretofore obtained with similar processes. It is also an object of the invention to provide an improved solid-state diffusion process.

One aspect of the invention is embodied in a composition comprising a suitable solvent having dissolved therein a suitable dopant and a reaction product of tetraethylorthosilicate plus acetic anhydride or acetic acid. For example, a preferred composition is formulated by adding tetraethylorthosilicate, acetic anhydride, and boron oxide to ethyl alcohol.

Tetraethylorthosilicate and acetic anhydride react to yield in equilibrium ethyl acetate, triethoxysilicon acetate and diethoxysilicon diacetate. The addition of a molar excess of acetic anhydride causes the diacetate to predominate, but such predominance is not essential to the invention.

Ethyl alcohol is a preferred solvent, even though some interaction of the alcohol with the diethoxysilicon diacetate species does occur to produce triethoxysilicon acetate, which tends, of course, to limit the amount of diacetate produced; but this effect does not detract materially from the success of the invention. Other useful solvents include acetone, methyl ethyl ketone, toluene, ethyl ether and the dialkyl ethers of ethylene glycol, such as the dimethyl ether, for example.

The conductivity type-determining dopant for diffusion in silicon is generally selected from boron, phosphorus, and arsenic. Gold is also a useful dopant for lifetime control. These dopants are preferably added to the compositions of the invention in the form of boron oxide, orthophosphoric acid, orthoarsenic acid, and gold chloride, respectively. Other dopant species are useful, with essentially equivalent results. Zinc chloride is a suitable source of zinc for diffusion in gallium arsenide.

The compositions of the invention include about 50–85% by weight solvent, and a ratio of silicon atoms to dopant atoms of about 1.5 to 1 up to about 6 to 1, depending primarily upon the doping level required in the semiconductor. The molar ratio of acetic anhydride to tetraethylorthosilicate added is about 1.5 to 1 up to 3 to 1, and preferably about 2.0 to 1 up to 2.3 to 1.

The undoped solution, to which dopants are added, is prepared by refluxing the acetic anhydride and tetraethylorthosilicate in ethanol or other solvent for one to eight hours, and preferably about 2 to 6 hours, with stirring. In order to minimize the amount of moisture entering the system, the reflux condenser should be attached to a drying tube. The amount of solvent added determines the eventual thickness of the film obtained upon application to the semiconductor. For example, 45 ml. of tetraethylorthosilicate plus 40 ml. acetic anhydride reacted in 200 ml. ethanol will produce a composition that yields a film approximately 1200 Angstroms thick.

When the compositions are applied to a semiconductor surface by spinning, spraying or dipping, solvent evaporation causes the precipitation of a doped silicon polymer film which is readily converted to doped $SiO_2$ by heating at a temperature as low as 200° C. to drive off volatile by-products, residual solvent, and any water which remains. Subsequent heating to diffusion temperatures of about 1100° C., for example, causes dopant to pass from the oxide film into the semiconductor, as will be readily appreciated by one skilled in the art.

The preferred application method is by spinning, which is conveniently accomplished with the use of photoresist spincoating equipment, an example of which is Model 6604 of Industrial Modular Systems Corporation of Cupertino, California. A proper selection of spin rate will determine the thickness of the resulting film, which also depends upon the initial solution viscosity.

EXAMPLE I

The basic undoped spin-on solution was prepared by mixing 45 ml. tetraethylorthosilicate, 40 ml. acetic anhydride, and 200 ml. ethanol in a 500 ml. round bottom flask. A reflux condenser and a teflon covered magnetic stirring bar were then added and the mixture was warmed with stirring to a slow reflux temperature for six hours.

3.7 grams of $B_2O_3$ were added to the undoped solution (285 ml.) as prepared above, and the mixture was warmed overnight with stirring.

The doped solution was then applied to clean, dust-free silicon slices (4 ohm-cm. n-type) at a spin rate of 3,000 rpm for about 10 seconds. The slices were baked at 300° C. for 10 minutes to drive off excess solvent and to densify the resulting oxide film.

The slices were then placed in a diffusion furnace for 30 minutes at 1150° C. in $N_2$. The results obtained was a sheet resistance of 8.9 ohms per square, a junction depth of 2.4 microns and a surface dopant concentration of $3 \times 10^{20}$ atoms/$cm^3$.

EXAMPLE II 7.5 grams of $H_3A_5O_4$ were added to 285 ml. of the undoped solution as in Example I, and the resulting solution applied to slices of 10 ohm-cm p-type silicon for 120 minutes at 1150° C. in $O_2$. The result obtained was a junction depth of 1.9 microns, a sheet resistance of 12.3 ohms per square, and a surface concentration of $2.2 \times 10^{20}$ atoms/$cm^3$.

EXAMPLE III 6 grams of phosphoric acid were added to 285 ml. of the undoped solution prepared as in Example I, and the resulting solution was applied to slices of 10 ohm-cm. p-type silicon for 60 minutes at 1150° C. in $O_2$. The result was a junction depth of 2.8 microns, a sheet resistance of 9.0 ohms per square, and a surface concentration of $2 \times 10^{20}$ atoms/$cm^3$.

EXAMPLE IV 9.5 grams of $ZnCl_2$ were added to 285 ml. of undoped solution prepared as in Example I, and the doped solution was applied to n-type gallium arsenide at 1000° C. for 30 minutes in forming gas. The result was a p-n junction depth of about 4 microns.

EXAMPLE V 1.0 gram of $HAuCl_4 \cdot 3H_2O$ was added to 100 ml. of undoped solution prepared as in Example I, and the doped solution was applied to slices of 0.2 ohm-cm p-type silicon at 1150° C. using a 10 minute $O_2$, 25 minute steam, 20 minute $O_2$ cycle. The result was a surface gold concentration of $4 \times 10^{15}$ atoms/$cm^3$.

The compositions of the invention are particularly useful for obtaining higher doping densities than are feasible with prior formulations. Such higher densities are possible because of the higher solubility of the solids-forming species in the solvent, particularly when ethanol is selected as the solvent. This permits one to obtain thicker oxide films on the semiconductor, and higher concentrations of dopant in the oxide.

We claim:

1. A method for the solid state diffusion of conductivity type-determining impurities in a semiconductor comprising the steps of applying a doped oxide-forming solution to said semiconductor, said solution comprising a. a reaction product of tetraethylorthosilicate plus acetic acid or acetic anhydride, the molar ratio of acetic anhydride or acetic acid to tetraethylorthosilicate being from about 1.5 to 1 up to 3 to 1;

b. a suitable dopant for solid state diffusion into a semiconductor, in sufficient proportion to provide a ratio of silicon atoms to dopant atoms of about 1.5 to 1 up to about 6 to 1; and 50 to 85 percent by weight of a solvent capable of maintaining said product and said dopant in solution; and then heating the coated semiconductor to a diffusion temperature.

2. A method as in claim 1 wherein said solvent is ethanol.

3. A method as in claim 2 wherein said reaction product comprises diethoxysilicon diacetate.

4. A method as in claim 3 wherein said dopant comprises boron oxide.

5. A method as in claim 3 wherein said dopant comprises a compound of boron, phosphorus, arsenic, gold or zinc.

* * * * *